(12) United States Patent
Todorov et al.

(10) Patent No.: US 9,711,279 B2
(45) Date of Patent: Jul. 18, 2017

(54) DC-DC CONVERTER ASSEMBLY WITH AN OUTPUT INDUCTOR ACCOMMODATING A POWER STAGE ATTACHED TO A CIRCUIT BOARD

(71) Applicant: Infineon Technologies Austria AG, Villach (AT)

(72) Inventors: Emil Todorov, Fremont, CA (US); Brian Molloy, Milpitas, CA (US)

(73) Assignee: Infineon Technologies Austria AG, Villach (AT)

( * ) Notice: Subject to any disclaimer, the term of this patent is extended or adjusted under 35 U.S.C. 154(b) by 675 days.

(21) Appl. No.: 14/065,021

(22) Filed: Oct. 28, 2013

(65) Prior Publication Data

US 2015/0116972 A1    Apr. 30, 2015

(51) Int. Cl.
| | |
|---|---|
| *H01F 5/00* | (2006.01) |
| *H01F 27/00* | (2006.01) |
| *H01F 41/02* | (2006.01) |
| *H02M 3/156* | (2006.01) |
| *H02M 3/00* | (2006.01) |

(Continued)

(52) U.S. Cl.
CPC ......... *H01F 41/0246* (2013.01); *H01F 17/06* (2013.01); *H01F 27/2847* (2013.01); *H01F 27/292* (2013.01); *H02M 3/00* (2013.01); *H02M 3/156* (2013.01); *H01L 2924/0002* (2013.01); *H05K 1/18* (2013.01); *Y10T 29/49075* (2015.01); *Y10T 29/49128* (2015.01)

(58) Field of Classification Search
CPC ............................................. H01F 27/00–27/30

USPC .................................. 336/65, 83, 192, 200, 232
See application file for complete search history.

(56) References Cited

U.S. PATENT DOCUMENTS

| | | | |
|---|---|---|---|
| 2003/0031339 | A1 | 2/2003 | Marshall et al. |
| 2004/0140877 | A1 | 7/2004 | Nakao et al. |

(Continued)

FOREIGN PATENT DOCUMENTS

| | | | |
|---|---|---|---|
| JP | 2005522173 | A | 7/2005 |
| JP | 2008092653 | A | 4/2008 |

(Continued)

OTHER PUBLICATIONS

"60A Power Block Non-Isolated DC-DC Converter", Murata Power Solutions, Okami OKLP-X/60-W12A-C.

(Continued)

*Primary Examiner* — Tuyen Nguyen
(74) *Attorney, Agent, or Firm* — Murphy, Bilak & Homiller, PLLC

(57) ABSTRACT

A DC-DC converter assembly includes a board having a first side and a second side opposite the first side, a power stage die of a DC-DC converter attached to the first side of the board, and an output inductor electrically connected to an output of the power stage die and disposed over the power stage die on the first side of the board. The output inductor includes a magnetic core and an electrical conductor having first and second terminals attached to the first side of the board. The output inductor accommodates the power stage die under the magnetic core so that the power stage die is interposed between the magnetic core and the board. A corresponding method of manufacturing the DC-DC converter assembly and method of manufacturing the output inductor are also disclosed.

21 Claims, 9 Drawing Sheets

(51) Int. Cl.
*H01F 17/06* (2006.01)
*H01F 27/28* (2006.01)
*H01F 27/29* (2006.01)
*H05K 1/18* (2006.01)

(56) References Cited

U.S. PATENT DOCUMENTS

| | | |
|---|---|---|
| 2006/0279267 A1* | 12/2006 | Burton ................ H02M 7/003 |
| | | 323/282 |
| 2009/0147541 A1 | 6/2009 | Shimada et al. |
| 2010/0085139 A1* | 4/2010 | Yan .................... H01F 1/15358 |
| | | 336/221 |
| 2011/0228507 A1* | 9/2011 | Yin ...................... H01L 23/495 |
| | | 361/811 |
| 2011/0242775 A1 | 10/2011 | Schaible et al. |
| 2012/0069529 A1 | 3/2012 | Chen et al. |
| 2013/0099886 A1 | 4/2013 | Yan et al. |
| 2016/0164417 A1 | 6/2016 | Ishii et al. |

FOREIGN PATENT DOCUMENTS

| | | |
|---|---|---|
| JP | 3147172 U | 11/2008 |
| JP | 2011019083 A | 1/2011 |
| WO | 03085476 A1 | 10/2003 |

OTHER PUBLICATIONS

"Programmable Output 12-Amp iLGA SMT PoL DC-DC Converter Series", Murata Power Solutions, Okami OKL2-T/12-W12 Series.
"Programmable Output 3-Amp iLGA SMT PoLs", Murata Power Solutions, Okami OKL-T/3-W5 Series.

\* cited by examiner

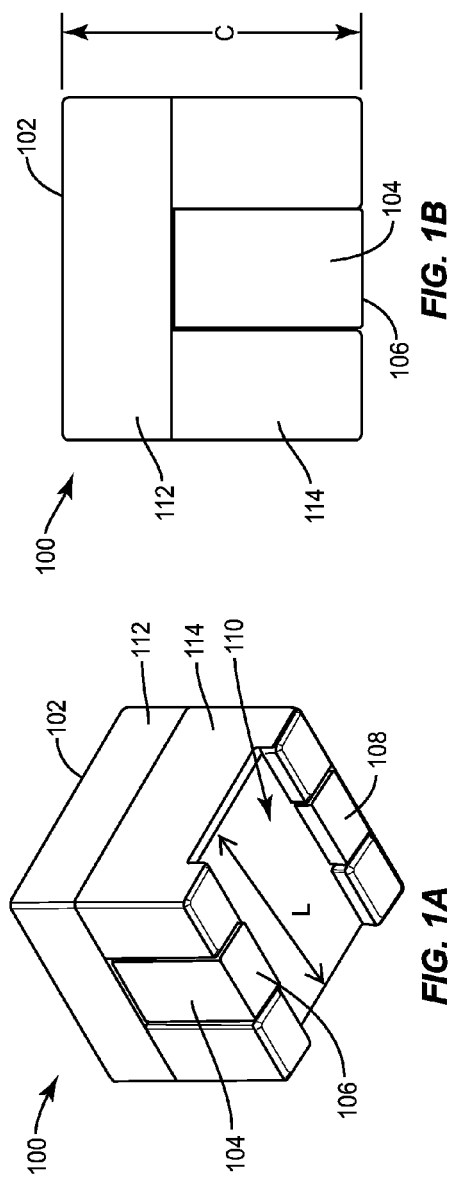
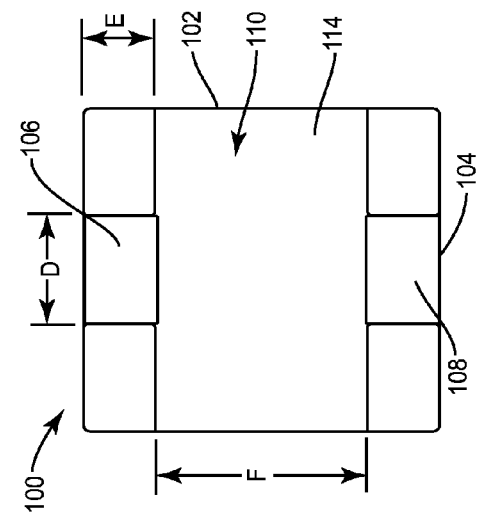
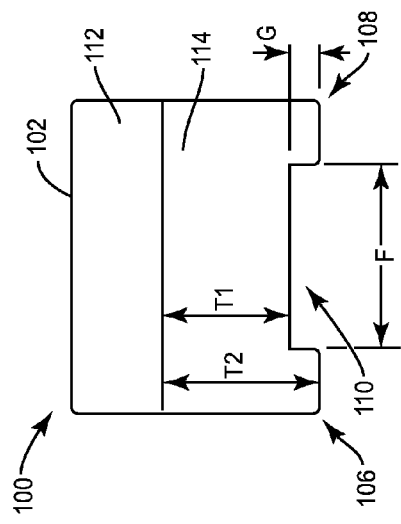

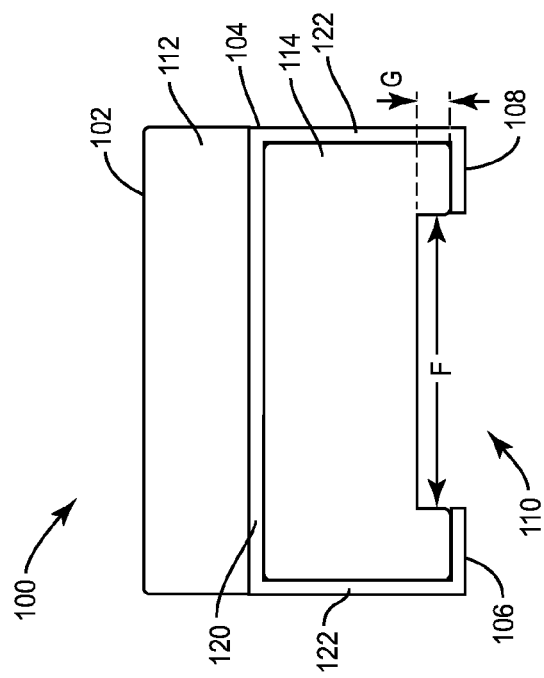
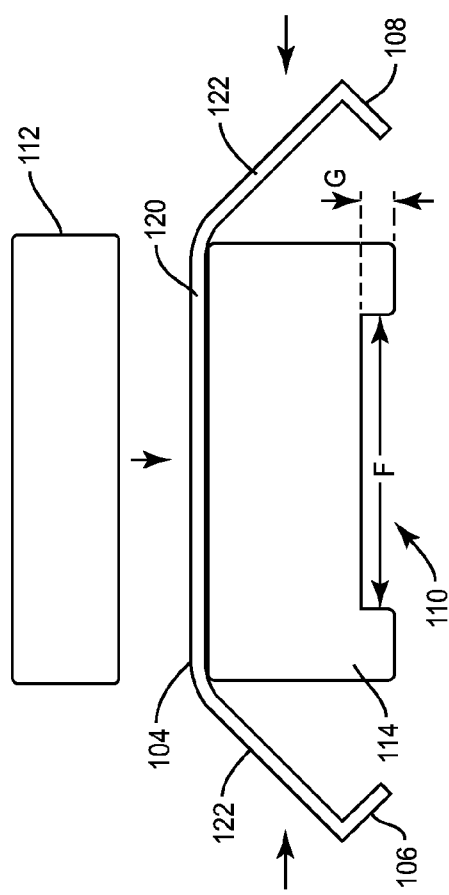

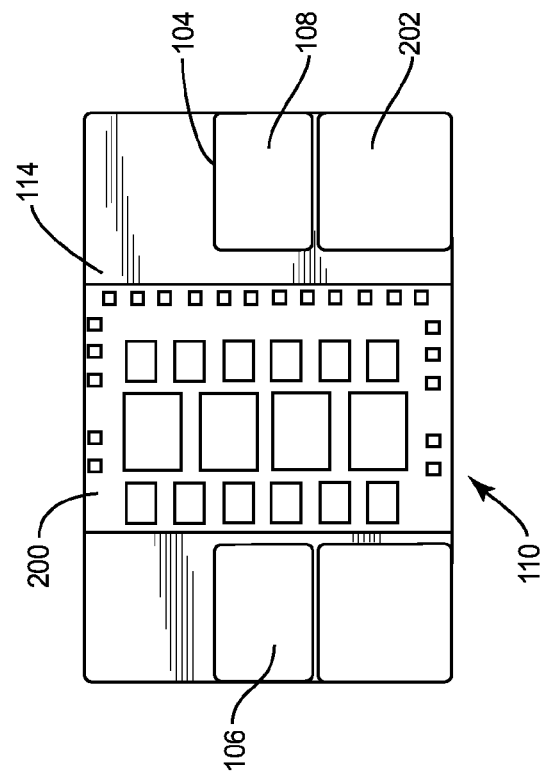
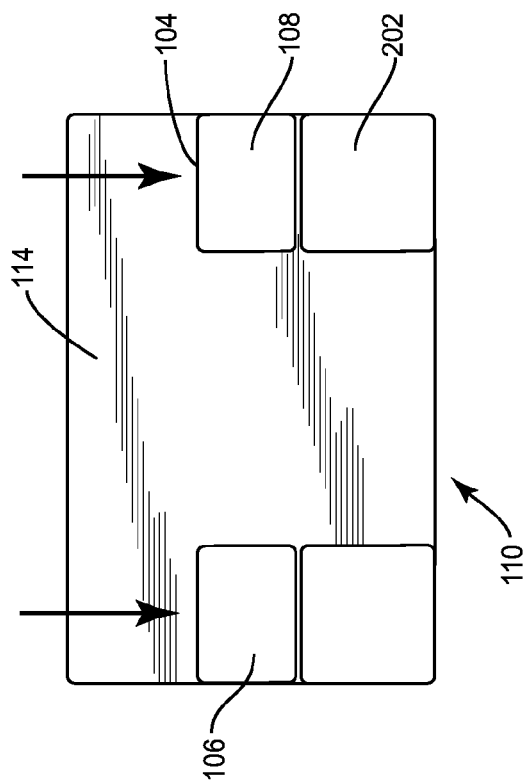

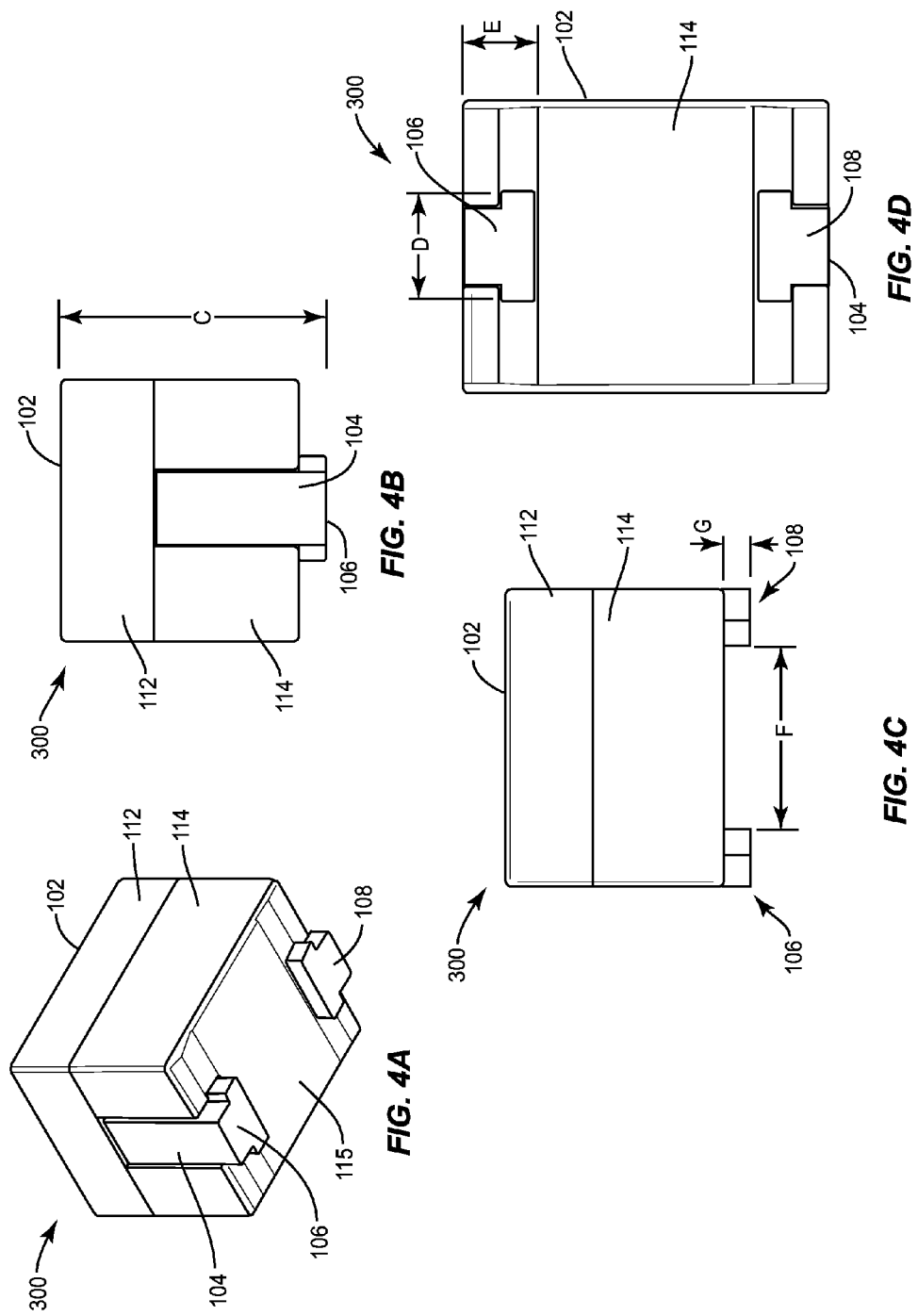

DC-DC CONVERTER ASSEMBLY WITH AN OUTPUT INDUCTOR ACCOMMODATING A POWER STAGE ATTACHED TO A CIRCUIT BOARD

TECHNICAL FIELD

The instant application relates to DC-DC converters, and more particularly to optimal placement of DC-DC converter components on a circuit board.

BACKGROUND

DC-DC converters include several active and passive components, including a power stage for regulating the voltage of a load such as a processor. The power stage is coupled to the load by an output inductor. The components of a DC-DC converter, including the output inductor, are attached to a printed circuit board (PCB) together with the load. The PCB has various electrical pathways for electrically interconnecting the components of the DC-DC converter, and electrically connecting the power stage of the converter to the load. DC-DC converter power stages are conventionally attached to the PCB in the same plane as the output inductor, increasing the size of the PCB. Also, conventional layout design practices for PCBs further complicate such an arrangement of the DC-DC converter components.

SUMMARY

According to an embodiment of a DC-DC converter assembly, the DC-DC converter assembly comprises a board having a first side and a second side opposite the first side, a power stage die of a DC-DC converter attached to the first side of the board, and an output inductor electrically connected to an output of the power stage die and disposed over the power stage die on the first side of the board. The output inductor comprises a magnetic core and an electrical conductor having first and second terminals attached to the first side of the board. The output inductor accommodates the power stage die under the magnetic core so that the power stage die is interposed between the magnetic core and the board.

According to an embodiment of a method of manufacturing a DC-DC converter assembly, the method comprises: attaching a power stage die of a DC-DC converter to a first side of a board, the board further having a second side opposite the first side; positioning an output inductor over the power stage die on the first side of the board, the output inductor comprising a magnetic core and an electrical conductor having first and second terminals, the output inductor accommodating the power stage die under the magnetic core so that the power stage die is interposed between the magnetic core and the board; and attaching the first and second terminals of the output inductor to the first side of the board so that the output inductor is electrically connected to an output of the power stage die.

According to an embodiment of a method of manufacturing an output inductor, the method comprises: forming first and second sections of a magnetic core, the second section having a thinner inner region and a thicker outer region, the thinner inner region being thin enough to accommodate a power stage die of a DC-DC converter positioned under the second section of the magnetic core without the power stage die contacting the thinner inner region and the thicker outer region of the second section; placing an electrical conductor on the second section; and attaching the first section to the second section so that the magnetic core secures the electrical conductor and the electrical conductor has contactable terminals.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A through 1D, illustrates different views of an embodiment of an output inductor shaped to accommodate a power stage die of a DC-DC converter.

FIG. 2, which includes FIGS. 2A and 2B, illustrates different steps of a method of manufacturing the output inductor of FIG. 1.

FIG. 3, which includes FIGS. 3A through 3D, illustrates different views of another embodiment of an output inductor shaped to accommodate a power stage die of a DC-DC converter.

FIG. 4, which includes FIGS. 4A through 4D, illustrates different views of yet another embodiment of an output inductor shaped to accommodate a power stage die of a DC-DC converter.

DETAILED DESCRIPTION

Figure 3B:
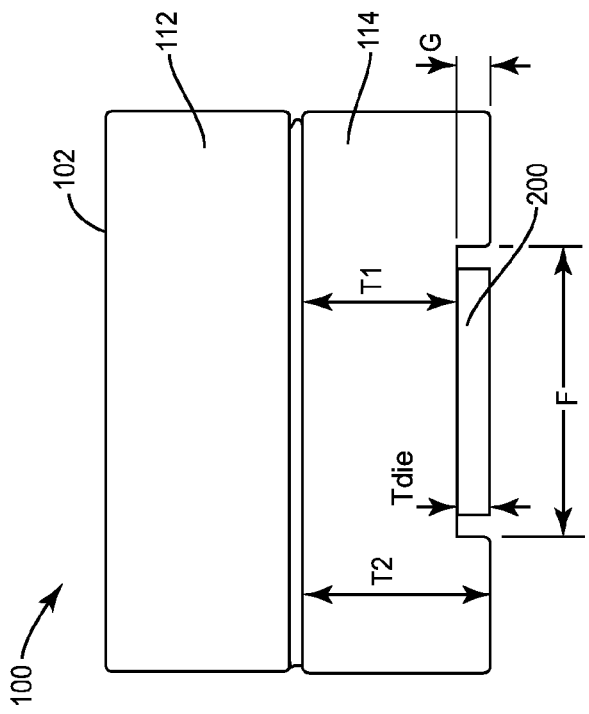

According to embodiments described herein, each power stage die of a DC-DC converter is placed under the corresponding output inductor for that power stage e.g. in a buck topology in order to reduce the overall size of the DC-DC converter solution. Each power stage provides an output phase of the converter to a load. In the case of a single-phase DC-DC converter, a single power stage is provided. In the case of a multi-phase DC-DC converter, a power stage is provided for each phase of the converter. Each power stage die delivers a phase current through an output inductor to the load regulated by the DC-DC converter. Each power stage die can have a high-side transistor and a low-side transistor for coupling to the load through the corresponding output inductor. The high-side transistor of each power stage switchably connects the load to an input voltage of the DC-DC converter and the corresponding low-side transistor switchably connects the load to ground at different periods. Each power stage die can include active semiconductor components such as MOSFETs (metal oxide semiconductor field effect transistors), drivers, etc. and corresponding passive components. The passive components can be excluded from the die and provided as separate components. In each case, the power stage die includes at least the active semiconductor components needed to provide an output phase of the DC-DC converter to the load and is placed under the corresponding output inductor when attached to a board such as a PCB to form a DC-DC converter assembly.

FIG. 1, which includes FIGS. 1A through 1D, illustrates different views of an output inductor 100 shaped to accommodate a power stage die of a DC-DC converter under the inductor 100. FIG. 1A shows an angled perspective of the output inductor 100, FIG. 1B shows a side view of the output inductor 100, FIG. 1C shows a front view of the output inductor 100, and FIG. 1D shows a bottom view of the output inductor 100.

The output inductor 100 comprises a magnetic core 102 and an electrical conductor 104 having first and second terminals 106, 108 for attaching to a board such as a PCB. The electrical conductor 104 can be shaped as a staple, for example. Regardless, the magnetic core 102 has a cutout 110 having a width (F) and length (L) to accommodate i.e. provide room for the power stage die. In addition, the terminals 104, 106 are spaced apart at opposing sides of the magnetic core 102 so that the power stage die fits between the terminals 104, 106. This way, the power stage die can be interposed between the magnetic core 102 and the board when the output inductor 100 and power stage die are attached to the same side of the board. The power stage die and board are not shown in FIG. 1 for ease of illustration.

According to this embodiment, the output inductor 100 is manufactured by forming first and second sections 112, 114 of the magnetic core 102. The second section 114 has a thinner inner region (T1) and a thicker outer region (T2). The thinner inner region T1 is thin enough to accommodate a power stage die of a DC-DC converter positioned under the second section 114 of the magnetic core 102 without the power stage die contacting the thinner inner region T1 and the thicker outer region T2 of the second section 114. The electrical conductor 104 of the output inductor 100 is placed on the second section 114 e.g. by sliding the conductor 104 in place over the second section 114. The thicker outer region T2 of the second section 114 has a width (E) along opposing sides of the thicker outer region T2. The terminals 106, 108 of the electrical conductor 104 have a width (D) and can be seated in notches formed in the opposing sides of the thicker outer region T2 of the second section 114.

The first section 112 is then attached to the second section 114 e.g. by an adhesive so that the magnetic core 102 secures the electrical conductor 104 and the terminals 106, 108 of the conductor 104 are contactable. In one embodiment, the second section 114 of the magnetic core 102 is formed by molding a magnetic material in a mold shaped to form the thinner inner region T1 and the thicker outer region T2 of the second section 114. Regardless, the magnetic core 102 has a total thickness (C) measured along the first section 112 and the thicker outer region T2 of the second section 114. The gap (G) between the thinner inner region T1 and the thicker outer region T2 of the second section 114 is sufficient to accommodate a power stage die of a DC-DC converter placed under the magnetic core 102 of the output inductor 100.

FIG. 2, which includes FIGS. 2A and 2B, illustrates different steps in an alternate method of manufacturing the output inductor 100 of FIG. 1. Instead of sliding the electrical conductor 104 into place on the second section 114 of the magnetic core 102, the electrical conductor 104 is shaped around the second section 114 as shown in FIG. 2A. According to this embodiment, the electrical conductor 104 has a planar top portion 120 placed on the top side of the second section 114 and legs 122 that are bent outward. After the planar top portion 120 of the conductor 104 is placed on the top side of the second section 114, the legs 122 are bent inward into contact with the corresponding sides of the second section 114 of the magnetic core 102 as indicated by the laterally inward facing arrows in FIG. 2A. The first section 112 is then attached to the second section 114 as indicated by the downward facing arrow in FIG. 2A. The resulting output inductor 100 with gap (G) for accommodating a power stage die of a DC-DC converter is shown in FIG. 2B.

Figure 3A:
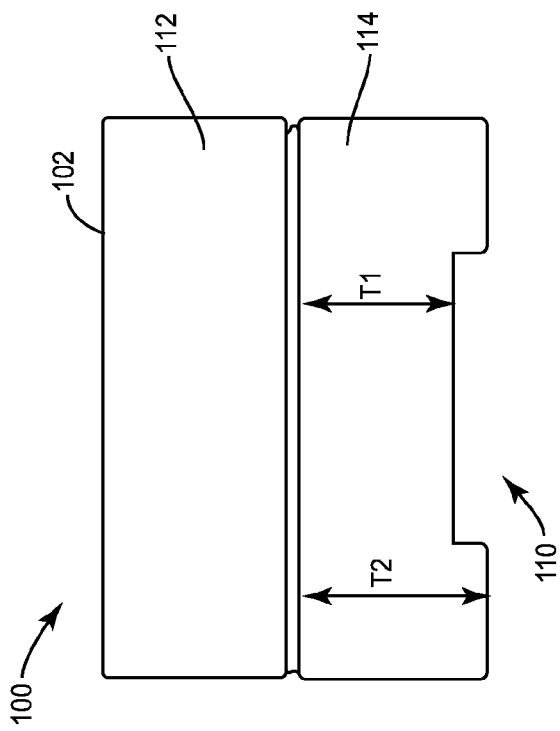

FIG. 3, which includes FIGS. 3A through 3D, illustrates different views of another embodiment of the output inductor 100. FIG. 3A shows a front side view of the output inductor 100, FIG. 3B shows a front side view of the output inductor 100 with a power stage die 200 of a DC-DC converter placed under the magnetic core 102 of the inductor 100, FIG. 3C shows a bottom view of the output inductor 100, and FIG. 3D shows a bottom view of the output inductor 100 with the power stage die 200 in place. The thickness of the power stage die 200 is labeled 'Tdie' and the gap in the magnetic core 102 which accommodates the power stage die 200 is labeled 'G' in FIG. 3B. The embodiment shown in FIG. 3 is similar to the embodiment shown in FIG. 1, however, the thicker outer region T2 of the second section 114 of the magnetic core 102 comprises a single post 202 at two ends which act as a stop for the electrical conductor 104 while being slid into place on the second section 114 in the direction indicated by the downward facings arrows in FIG. 3C. In one embodiment, the second section 114 of the magnetic core 102 is formed by molding a magnetic material in a mold shaped to yield the posts 202 at two ends of the second section 114.

FIG. 4, which includes FIGS. 4A through 4D, illustrates different views of yet another embodiment of an output inductor 300 shaped to accommodate a power stage die of a DC-DC converter under the output inductor 300. FIG. 4A shows an angled perspective of the output inductor 300, FIG. 4B shows a side view of the output inductor 300, FIG. 4C shows a front view of the output inductor 300, and FIG. 4D shows a bottom view of the output inductor 300. The embodiment shown in FIG. 4 is similar to the embodiment shown in FIG. 1, however, the second section 114 of the magnetic core 102 has a uniform thickness and therefore the bottom side 115 of the second section 114 is planar according to this embodiment. The terminals 106, 108 of the output inductor 300 extend from a periphery of the magnetic core 102 beyond the planar bottom side 115 of the second section 114 by a distance corresponding to at least the thickness of the power stage die to realize a gap (G) between the planar side 115 of the magnetic core 102 and the board to which the components are to be mounted. The gap realized by the extended terminals 106, 108 is sufficient to accommodate the power stage die under the magnetic core 102. The terminals 106, 108 of the output inductor 300 can be attached to the same side of the board as the power stage die. Alternatively, the terminals 106, 108 can be rounded leads which pass through the board and are soldered on the other side of the board. In each case, the power stage die and board are not shown in FIG. 4 for ease of illustration.

Figure 5:
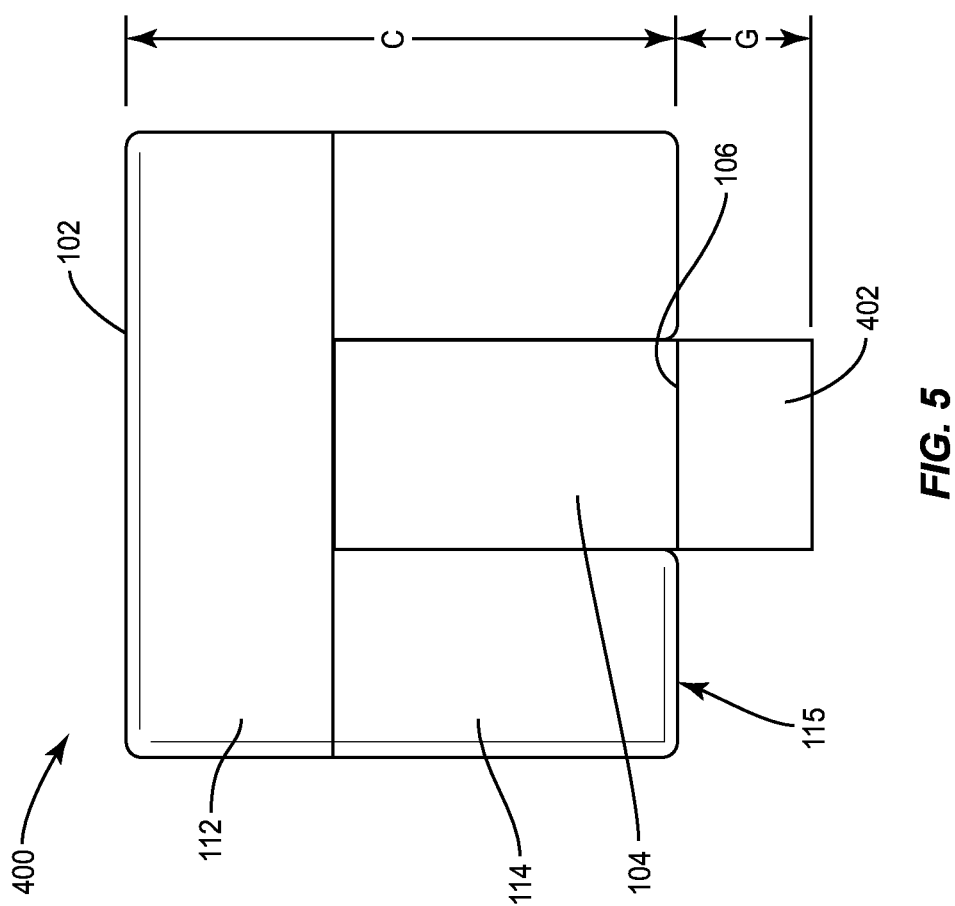
FIG. 5 illustrates a side view of still another embodiment of an output inductor shaped to accommodate a power stage die of a DC-DC converter.

FIG. 5 illustrates a side view of still another embodiment of an output inductor 400 shaped to accommodate a power stage die of a DC-DC converter under the output inductor 400. The embodiment shown in FIG. 5 is similar to the embodiment shown in FIG. 4, however, the terminals 106, 108 are generally coplanar with the bottom side 115 of the magnetic core 102. The height extension for accommodating the power stage die under the magnetic core 102 is provided by blocks 402 such as standoffs which are attached to each of the terminals 106, 108 at the periphery of the magnetic core 102. The blocks 402 each have a thickness corresponding to at least a thickness of the power stage die, to realize a gap (G) between the magnetic core 102 and the board to which the components are to be attached. The gap realized by the blocks 402 is sufficient to accommodate the power stage die under the magnetic core. The power stage die and board are not shown in FIG. 5 for ease of illustration.

Figure 6:
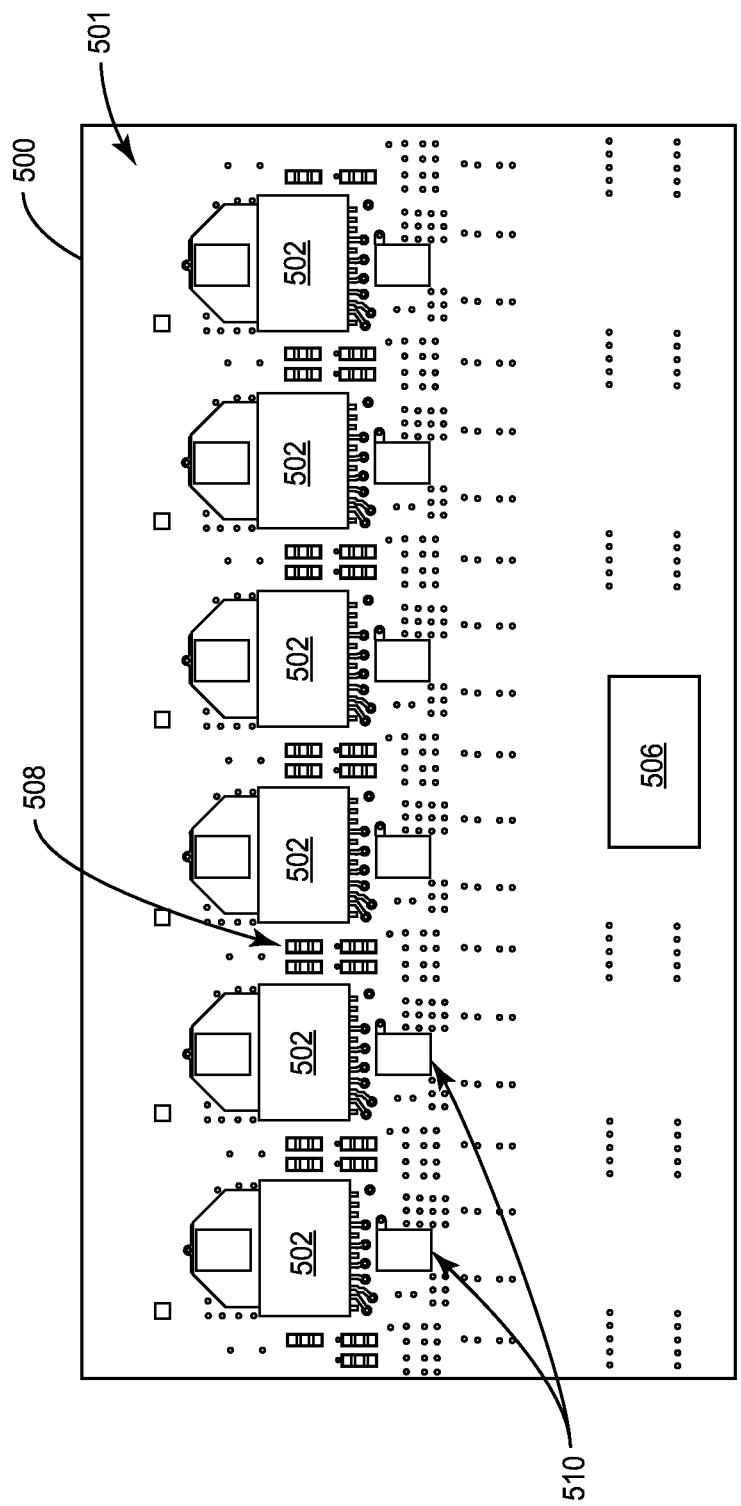
FIG. 6 illustrates a top plan view of an embodiment of a DC-DC converter assembly with output inductors shaped to accommodate power stage dies of a DC-DC converter.

FIG. 6 illustrates a plan view of a first side 501 of a PCB 500 to which a plurality of power stage dies 502 of a DC-DC converter are attached. In this case, the DC-DC converter is a multi-phase converter and each of the power stage dies 502 delivers a phase current through an output inductor 504 to a load 506 regulated by the DC-DC converter. FIG. 6 illustrates the DC-DC converter assembly prior to attachment of the output inductors 504 to the PCB 500. The load 506 is attached to the same side 501 of the PCB 500 as the power stage dies 502, and can be any type of circuit requiring a regulated voltage such as one or more processors. Also attached to the first side 501 of the PCB 500 are input capacitors 508 that provide the shortest current commutation loop for the respective power stage dies 502. In one embodiment, these input capacitors 508 are also accommodated under the output inductors 504. According to this embodiment, the power stage dies 502 and the input capacitors 508 attached to the first side 501 of the PCB 500 are interposed between the magnetic core of the corresponding output inductor 504 and the PCB 500 after attachment to the first side 501 of the PCB 500. In other embodiments, these input capacitors 508 are not accommodated under the output inductors 504. In either case, the input capacitors 508 attached to the first side 501 of the PCB 500 are electrically connected to input terminals of the corresponding power stage die 502 e.g. by electrically conductive vias and/or traces which are part of the PCB 500.

Figure 7:
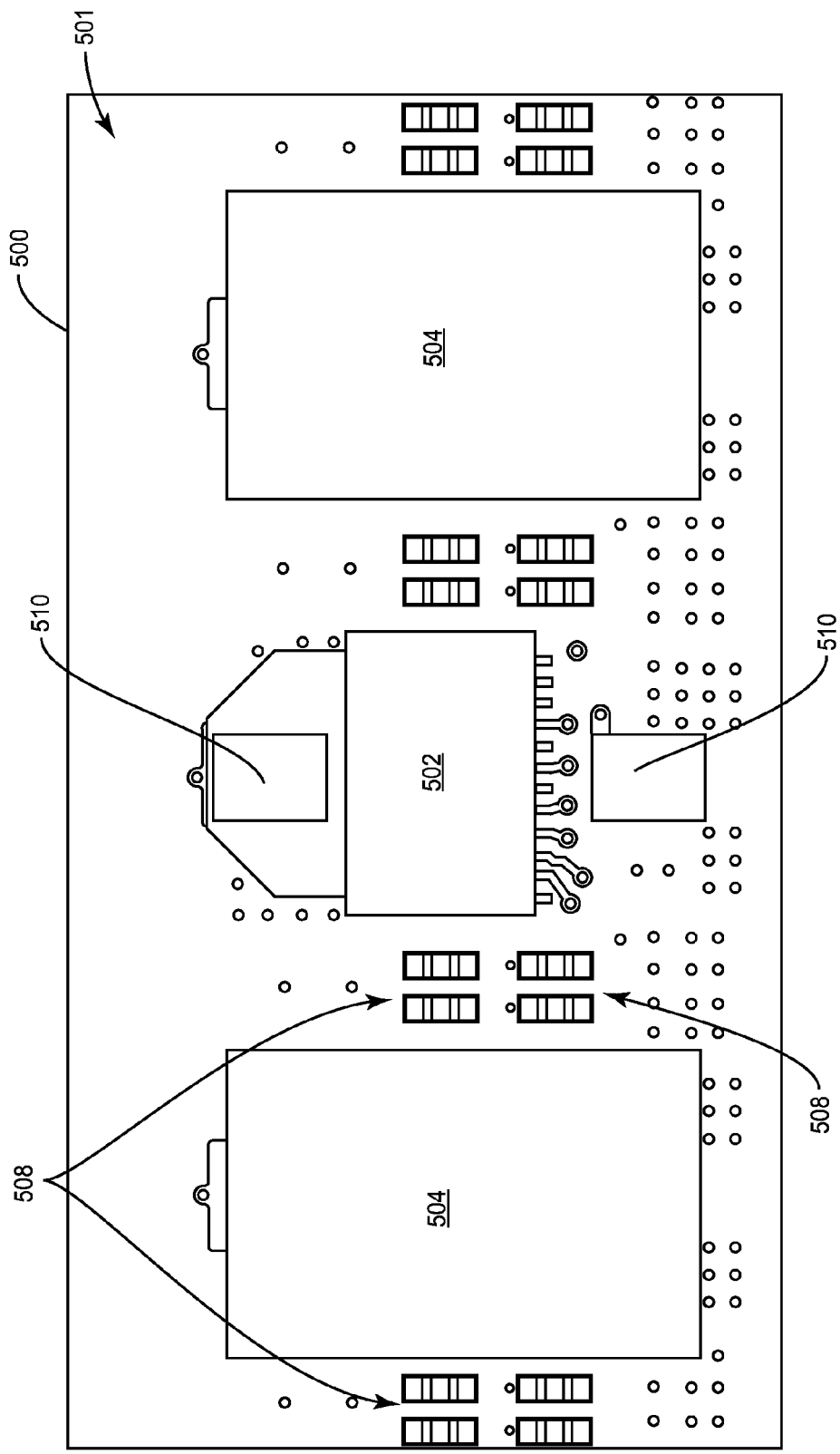
FIG. 7 illustrates an enlarged view of FIG. 6.

FIG. 7 illustrates an enlarged view of FIG. 6, after output inductors 504 shaped to accommodate the power stage dies 502 under the output inductors 504 are attached to the first side 501 of the PCB 500 over the respective power stage dies 502. Each of the output inductors 504 comprises a magnetic core and an electrical conductor having first and second terminals e.g. according to any of the inductor embodiments previously described herein. The terminals of each output inductor 504 are attached to electrically conductive contact regions 510 at the first side 501 of the PCB 500, electrically connecting the respective output inductors 504 to the output of the corresponding power stage die 502 e.g. by electrically conductive vias and/or traces of the PCB 500 connected to the contact regions 510. Each output inductor 504 accommodates the power stage die 502 under the magnetic core of that inductor 504 so that the power stage die 502 is interposed between the magnetic core and the PCB 500.

In one embodiment, the magnetic core of each output inductor 504 has a thinner inner region and a thicker outer region so that a gap exists between the thinner inner region and the first side 501 of the board 500 for accommodating the thickness of the corresponding power stage die 502 e.g. according to any of the embodiments illustrated in FIGS. 1 through 3. In another embodiment, the magnetic core of each output inductor 504 has a planar side facing the first side 501 of the board 500 and the terminals of the output inductor 504 extend from a periphery of the magnetic core beyond the planar side by a distance corresponding to at least the thickness of the corresponding power stage die 502 to realize a gap between the planar side of the magnetic core and the first side 501 of the PCB 500 that accommodates the power stage die 502 e.g. according to the embodiment illustrated in FIG. 4. In yet another embodiment, the terminals of each output inductor 504 are attached to the first side 501 of the PCB 500 by a set of blocks at a periphery of the magnetic core and each block has a thickness corresponding to at least the thickness of the corresponding power stage die 502 to realize a gap between the magnetic core and the first side 501 of the PCB 500 that accommodates the power stage die 502 e.g. according to the embodiment illustrated in FIG. 5. In each case the power stage dies 502 fit under the corresponding output inductor 504. In some cases the output inductors 504 completely cover the respective power stage dies 502 as shown in FIG. 7.

Each magnetic core of the output inductors 504 can contact or be spaced apart from the underlying power stage die 502. In one embodiment, the thickness (Tdie) of the power stage die 502 and the gap (G) between the thinner inner region and the first side 501 of the PCB 500 are both less than 1 mm (FIG. 3B illustrates an embodiment of the power stage die thickness 'Tdie' and the gap 'G' for accommodating the die under the inductor).

Less PCB surface area is needed when the power stage dies 502 are at least partly accommodated under the corresponding output inductors 504 as described herein, and therefore the size of the PCB 500 can be reduced correspondingly. The stacked inductor/power stage die arrangements described herein are also particularly advantageous for power stage dies 502 that dissipate low power and therefore do not require a dedicated heat sink on the side of the power stage die 502 facing the corresponding output inductor 504. In one embodiment, each power stage die 502 such as Infineon part number DrBlade TDA21320 dissipates less than 2 W at a thermal design current (TDC) of the DC-DC converter. TDC is the sustained (DC equivalent) current that the load (e.g. processor) is capable of drawing indefinitely and defines the current to use for worst-case voltage regulator temperature assessment. At TDC, voltage regulator components (such as switching transistors and inductors) reach maximum temperature and may heat the PCB layers and neighboring components above their thermal limits. Actual component and board temperatures are established by the envelope of system operating conditions. This includes but is not limited to the DC-DC converter layout, load fan selection, ambient temperature, chassis configuration, etc.

Figure 8:
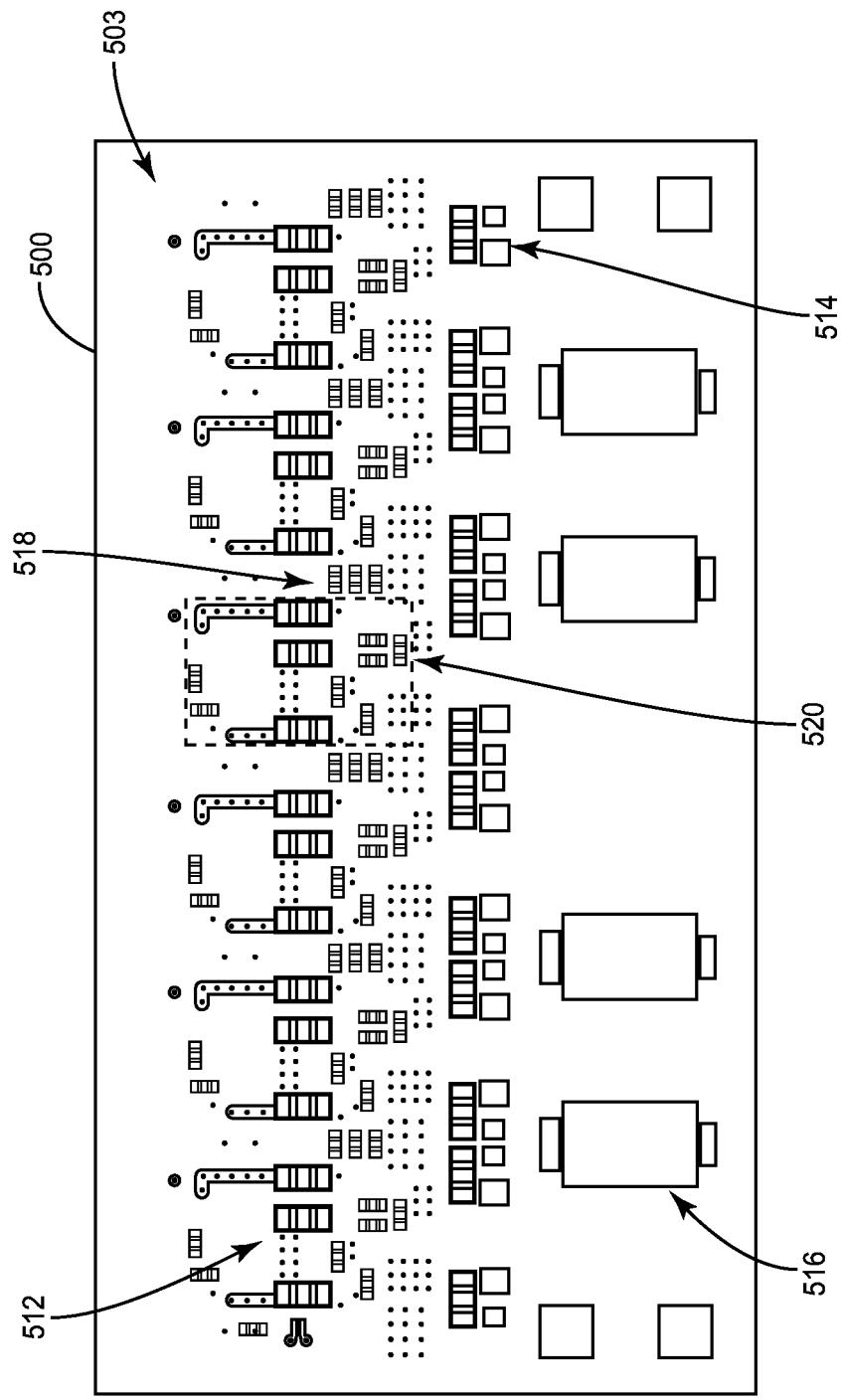
FIG. 8 illustrates a bottom plan view of the DC-DC converter assembly of FIG. 6.

FIG. 8 illustrates a plan view of a second side 503 of the PCB 500. The second side 503 is opposite the first side 501 shown in FIGS. 6 and 7. Input capacitors 512 other than the ones providing the shortest current commutation loop for the power stage dies 502 are attached to the second side 503 of the PCB 500. Also attached to the second side 503 of the PCB 500 are output capacitors 514 electrically connected between the respective output inductors 504 and the load 506. Decoupling capacitors 516 electrically connected to the power terminals of the power stage dies 502 are also attached to the second side 503 of the PCB 500. Additional passive components electrically connected to the power stage dies 502 can also be attached to the second side 503 of the PCB 500 such as boot capacitors 518, capacitors 520 for current monitoring circuits, etc. At least some of these capacitors 512, 514, 516, 518, 520 can be disposed on the second side 503 of the PCB 500 at least partly within the footprint of the corresponding output inductor 504 attached to the first side 501 of the PCB 500. The footprint of one of the output inductors 504 is indicated by a dashed box in FIG. 8. The quantity and type of passive components attached to the second side 503 of the PCB 500 depend on the type of power stage dies 502 and DC-DC converter. In one embodiment, the footprint of the components of the DC-DC converter system is at least half or at least a third of the size as the combined surface area of the individual components.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A DC-DC converter assembly, comprising:
   a board having a first side and a second side opposite the first side;
   a power stage die of a DC-DC converter attached to the first side of the board;
   an output inductor electrically connected to an output of the power stage die and disposed over the power stage die on the first side of the board, the output inductor comprising a magnetic core and an electrical conductor having first and second terminals attached to the first side of the board, the output inductor accommodating the power stage die under the magnetic core so that the power stage die is interposed between the magnetic core and the board;
   a load attached to the first side of the board;
   a plurality of input capacitors electrically connected to input terminals of the power stage die, the input capacitors that provide a shortest current commutation loop for the power stage die being attached to the first side of the board and the other input capacitors being attached to the second side of the board;
   an output capacitor electrically connected between the output inductor and the load, and attached to the second side of the board; and
   a plurality of decoupling capacitors electrically connected to power terminals of the power stage die, and attached to the second side of the board,
   wherein a total footprint of the power stage die, the output inductor, the plurality of input capacitors, the output capacitor and the plurality of decoupling capacitors is at least a third of the combined surface area of the power stage die, the output inductor, the plurality of input capacitors, the output capacitor and the plurality of decoupling capacitors.

2. The DC-DC converter assembly of claim 1, wherein the magnetic core is spaced apart from the power stage die.

3. The DC-DC converter assembly of claim 1, wherein the magnetic core has a thinner inner region and a thicker outer region so that a gap exists between the thinner inner region and the first side of the board, and wherein the gap accommodates a thickness of the power stage die.

4. The DC-DC converter assembly of claim 3, wherein the thickness of the power stage die and the gap between the thinner inner region and the first side of the board are both less than 1 mm.

5. The DC-DC converter assembly of claim 1, wherein the magnetic core has a planar side facing the first side of the board, and wherein the first and second terminals of the output inductor extend from a periphery of the magnetic core beyond the planar side by a distance corresponding to at least a thickness of the power stage die to realize a gap between the planar side of the magnetic core and the board that accommodates the power stage die.

6. The DC-DC converter assembly of claim 1, wherein the first and second terminals of the magnetic core are attached to the first side of the board by first and second blocks at a periphery of the magnetic core, and wherein the first and second blocks each have a thickness corresponding to at least a thickness of the power stage die to realize a gap between the magnetic core and the board that accommodates the power stage die.

7. The DC-DC converter assembly of claim 1, wherein the DC-DC converter is a multi-phase converter and the power stage die provides one phase of the multi-phase converter.

8. The DC-DC converter assembly of claim 1, wherein the power stage die dissipates less than 2 W at a thermal design current of the DC-DC converter.

9. The DC-DC converter assembly of claim 1, wherein the output inductor accommodates the input capacitors attached to the first side of the board under the magnetic core so that the power stage die and the input capacitors attached to the first side of the board are interposed between the magnetic core and the board after attachment to the first side of the board.

10. The DC-DC converter assembly of claim 1, wherein at least some of the capacitors attached to the second side of the board are disposed at least partly within the footprint of the output inductor attached to the first side of the board.

11. The DC-DC converter assembly of claim 1, wherein the electrical conductor is shaped like a staple and the terminals are spaced apart at opposing sides of the magnetic core so that power stage die fits between the terminals.

12. The DC-DC converter assembly of claim 1, wherein the output inductor completely covers the power stage die.

13. A method of manufacturing a DC-DC converter assembly, the method comprising:
    attaching a power stage die of a DC-DC converter to a first side of a board, the board further having a second side opposite the first side;
    positioning an output inductor over the power stage die on the first side of the board, the output inductor comprising a magnetic core and an electrical conductor having first and second terminals, the output inductor accommodating the power stage die under the magnetic core so that the power stage die is interposed between the magnetic core and the board;
    attaching the first and second terminals of the output inductor to the first side of the board so that the output inductor is electrically connected to an output of the power stage die;
    attaching a load to the first side of the board;
    attaching input capacitors that provide a shortest current commutation loop for the power stage die to the first side of the board, the input capacitors being electrically connected to input terminals of the power stage die;

attaching additional input capacitors to the second side of the board, the additional input capacitors being electrically connected to the input terminals of the power stage die;

attaching an output capacitor to the second side of the board, the output capacitor being electrically connected between the output inductor and the load; and attaching a plurality of decoupling capacitors to the second side of the board, the decoupling capacitors being electrically connected to power terminals of the power stage die, wherein a total footprint of the power stage die, the output inductor, the plurality of input capacitors, the output capacitor and the plurality of decoupling capacitors is at least a third of the combined surface area of the power stage die, the output inductor, the plurality of input capacitors, the output capacitor and the plurality of decoupling capacitors.

14. The method of claim 13, wherein the magnetic core has a thinner inner region and a thicker outer region so that a gap exists between the thinner inner region and the first side of the board, and wherein the gap accommodates a thickness of the power stage die.

15. The method of claim 13, wherein the magnetic core has a planar side facing the first side of the board, and wherein the first and second terminals of the output inductor extend from a periphery of the magnetic core beyond the planar side by a distance corresponding to at least a thickness of the power stage die to realize a gap between the planar side of the magnetic core and the board that accommodates the power stage die.

16. The method of claim 13, comprising attaching the first and second terminals of the output inductor to the first side of the board by first and second blocks at a periphery of the magnetic core, and the first and second blocks each having a thickness corresponding to at least a thickness of the power stage die to realize a gap between the magnetic core and the board that accommodates the power stage die.

17. The method of claim 13, wherein the DC-DC converter is a multi-phase converter and the power stage die provides one phase of the multi-phase converter.

18. The method of claim 13, wherein the power stage die dissipates less than 2 W at a thermal design current of the DC-DC converter.

19. The method of claim 13, wherein the output inductor accommodates the input capacitors attached to the first side of the board under the magnetic core so that the power stage die and the input capacitors attached to the first side of the board are interposed between the magnetic core and the board after attachment to the first side of the board.

20. The DC-DC converter assembly of claim 1, wherein the total footprint of the power stage die, the output inductor, the plurality of input capacitors, the output capacitor and the plurality of decoupling capacitors is at least half the combined surface area of the power stage die, the output inductor, the plurality of input capacitors, the output capacitor and the plurality of decoupling capacitors.

21. The method of claim 13, wherein the total footprint of the power stage die, the output inductor, the plurality of input capacitors, the output capacitor and the plurality of decoupling capacitors is at least half the combined surface area of the power stage die, the output inductor, the plurality of input capacitors, the output capacitor and the plurality of decoupling capacitors.

* * * * *